(12) United States Patent
Sato

(10) Patent No.: US 9,678,378 B2
(45) Date of Patent: Jun. 13, 2017

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 40 days.

(21) Appl. No.: 14/678,083

(22) Filed: Apr. 3, 2015

(65) Prior Publication Data

US 2015/0286103 A1   Oct. 8, 2015

(30) Foreign Application Priority Data

Apr. 8, 2014  (JP) ................. 2014-079775

(51) Int. Cl.
| | | |
|---|---|---|
| *H01L 29/08* | (2006.01) | |
| *G02F 1/1334* | (2006.01) | |
| *G02F 1/1333* | (2006.01) | |
| *G02F 1/1343* | (2006.01) | |

(52) U.S. Cl.
CPC ...... *G02F 1/1334* (2013.01); *G02F 1/133377* (2013.01); *G02F 1/134336* (2013.01); *G02F 2201/44* (2013.01)

(58) Field of Classification Search
CPC ............. G02F 1/134309; G02F 1/1334; G02F 1/133512; G02F 1/133377; G02F 1/134336; G02F 2201/44
USPC ........................................................ 257/40
See application file for complete search history.

(56) References Cited

U.S. PATENT DOCUMENTS

| | | | | |
|---|---|---|---|---|
| 2009/0162607 | A1* | 6/2009 | Lee ......... | H05K 3/361 428/137 |
| 2010/0052528 | A1* | 3/2010 | Park ......... | H01L 51/5281 313/506 |
| 2011/0198598 | A1* | 8/2011 | Kim ......... | H01L 27/3246 257/59 |
| 2012/0319114 | A1* | 12/2012 | Yamazaki ... | H01L 29/78618 257/57 |
| 2014/0145158 | A1* | 5/2014 | Choi ......... | H01L 27/3246 257/40 |
| 2014/0273317 | A1* | 9/2014 | Chida ........ | H01L 33/20 438/26 |
| 2015/0014650 | A1* | 1/2015 | Lim ......... | H01L 27/3262 257/40 |

FOREIGN PATENT DOCUMENTS

| | | |
|---|---|---|
| JP | 2006-276089 A | 10/2006 |
| WO | 2013/038970 A1 | 3/2013 |

* cited by examiner

*Primary Examiner* — Charles Chang
(74) *Attorney, Agent, or Firm* — Typha IP LLC

(57) ABSTRACT

A display device includes: a substrate including a display area composed of a plurality of pixels disposed in a matrix; lower electrodes each formed in each of the plurality of pixels on the substrate and composed of a conductor; an organic layer formed on the lower electrodes and including a light-emitting layer; an upper electrode formed on the organic layer and composed of a conductor; and a pixel separation film at least a portion of which includes polymer dispersed liquid crystal, the pixel separation film being in contact with edges of the lower electrodes to insulate between the lower electrodes of the pixels adjacent to each other.

9 Claims, 9 Drawing Sheets

DISPLAY DEVICE

CROSS-REFERENCE TO RELATED APPLICATION

The present application claims priority from Japanese application JP 2014-079775 filed on Apr. 8, 2014, the content of which is hereby incorporated by reference into this application.

BACKGROUND OF THE INVENTION

1. Field of the Invention

The present invention relates to a display device including a light-emitting element.

2. Description of the Prior Art

In recent years, light-emitting element display devices using a self-luminous body such as an OLED (Organic Light-Emitting Diode) have been put to practical use. Since the self-luminous body is used, the light-emitting element display devices including an organic EL (Electro-Luminescent) display device using the OLED are superior in terms of visibility and response speed compared to a related-art liquid crystal display device, and in addition, an auxiliary lighting device such as a backlight is not necessary. For this reason, a further reduction in thickness is possible in the light-emitting element display devices.

JP 2006-276089A discloses that, in an organic EL display device including a PDLC (Polymer Dispersed Liquid Crystal) layer, the PDLC layer is controlled so as to exhibit transparency in the state where a light-emittingelement emits light and to exhibit a light absorptive property in the state where the light-emitting element does not emit light.

WO 2013/038970 A1 discloses that a first electrode, a second electrode, an organic light-emitting layer formed between the first electrode and the second electrode, and a first bank that defines the first electrode into predetermined areas are included and the first bank is composed of a material having light reflectivity.

SUMMARY OF THE INVENTION

In a display device including a light-emitting element, when lights in different wavelength ranges are emitted using color filters or the like, there is a risk that so-called optical color mixture may occur in which light that is emitted obliquely from the light-emitting element transmits through a color filter of an adjacent pixel because of a distance provided between the light-emitting element and the color filter. A distance between pixels is narrowed due to recent higher definition, so that an influence of the optical color mixture on image quality is increasing. On the other hand, it is conceivable to increase the width of a light-shielding film, a so-called black matrix, disposed between pixels for preventing the optical color mixture. However, an increase in the occupied area of the black matrix leads to a reduction in luminous efficiency.

The invention has been made in view of the circumstances described above, and it is an object of the invention to provide a display device including a light-emitting element in which optical color mixture can be efficiently prevented even with higher definition pixels.

A display device according to an aspect of the invention includes: a substrate including a display area composed of a plurality of pixels disposed in a matrix; lower electrodes each formed in each of the plurality of pixels on the substrate and composed of a conductor; an organic layer formed on the lower electrodes and including a light-emitting layer; an upper electrode formed on the organic layer and composed of a conductor; and a pixel separation film at least a portion of which includes polymer dispersed liquid crystal, the pixel separation film being in contact with edges of the lower electrodes to insulate between the lower electrodes of the pixels adjacent to each other.

Here, the "pixel" means a unit including a light-emitting element where when the pixel is composed of a plurality of light-emitting elements and thus includes a plurality of sub-pixels, the pixel means a sub-pixel.

In the display device according to the aspect of the invention, a degree of light scattering of the pixel separation film may change due to a change in potential difference between the upper electrode and the lower electrode. In this case, further, the degree of the light scattering of the pixel separation film may increase as the potential difference between the upper electrode and the lower electrode increases.

In the display device according to the aspect of the invention, the polymer dispersed liquid crystal of the pixel separation film may be in contact with the lower electrode.

In the display device according to the aspect of the invention, the pixel separation film may include a first portion composed of an organic or inorganic material and a second portion composed of the polymer dispersed liquid crystal. In this case, the second portion maybe formed on and cover the first portion, and the first portion may be formed of a material having a higher light-shielding property than the second portion, and formed in contact with the second portion without being in contact with the lower electrode.

A display device according to an aspect of the invention includes: a substrate including a first pixel and a second pixel adjacent to the first pixel; a first lower electrode located in the first pixel; a second lower electrode located in the second pixel; a first organic layer formed on the first lower electrode and including a light-emitting layer; a second organic layer formed on the second lower electrode and including a light-emitting layer; a pixel separation film located at a boundary between the first pixel and the second pixel, being in contact with the first lower electrode and the second lower electrode, and including polymer dispersed liquid crystal; and an upper electrode formed to straddle the first pixel, the second pixel, and the pixel separation film.

In the display device according to the aspect of the invention, wherein the pixel separation film includes a polymer dispersed liquid crystal layer including the polymer dispersed liquid crystal, and the polymer dispersed liquid crystal layer is in contact with the first lower electrode and the second lower electrode.

In the display device according to the aspect of the invention, wherein a degree of light scattering of the pixel separation film increases as a potential difference between the upper electrode and the lower electrode increases.

In the display device according to the aspect of the invention, wherein the pixel separation film includes a first portion composed of an organic or inorganic material and a second portion composed of the polymer dispersed liquid crystal.

In the display device according to the aspect of the invention, wherein the first portion is formed on and covers the second portion.

In the display device according to the aspect of the invention, wherein the first portion is formed of a material having a higher light-shielding property than the second portion, and formed on and in contact with the second portion without being in contact with the lower electrode.

DETAILED DESCRIPTION OF THE INVENTION

Figure 1:
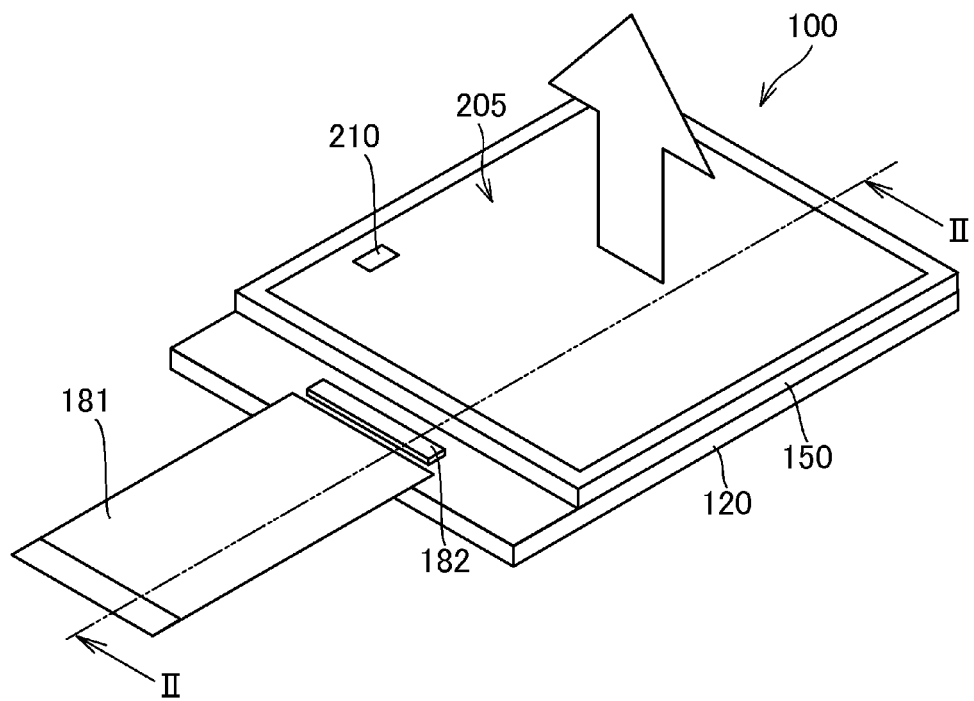
FIG. 1 is a diagram schematically showing an organic EL display device as a display device according to an embodiment of the invention.

Hereinafter, embodiments of the invention will be described with reference to the drawings. The disclosure is illustrative only. Appropriate modifications that will readily occur to those skilled in the art and fall within the gist of the invention are of course included in the scope of the invention. In the drawings, the width, thickness, shape, and the like of each part may be schematically represented, compared to those in practicing aspects of the invention, for more clarity of description. However, they are illustrative only, and do not limit the interpretation of the invention. Moreover, in the specification and the drawings, elements similar to those described relating to a previous drawing are denoted by the same reference numerals and signs, and a detailed description may be appropriately omitted.

FIG. 1 schematically shows an organic EL display device 100 as a display device according to an embodiment of the invention. As shown in the drawing, the organic EL display device 100 includes two substrates, a TFT (Thin Film Transistor) substrate 120 and a counter substrate 150. In the TFT substrate 120 and the counter substrate 150 of the organic EL display device 100, a display area 205 composed of pixels 210 disposed in a matrix is formed. Each of the pixels 210 is composed of a plurality of sub-pixels 212 (described later).

The TFT substrate 120 is a substrate composed of transparent glass or a resin insulating material, but maybe a substrate composed of other insulating materials. A driver IC (Integrated Circuit) 182 and an FPC (Flexible Printed Circuit) 181 are attached to the TFT substrate 120. The driver IC 182 is a driver circuit that applies, to a scanning signal line of a pixel transistor disposed in each of the sub-pixels 212, a potential for providing electrical conduction between a source and a drain, and also applies, to an image signal line, a voltage corresponding to the gray-scale value of the sub-pixel 212. The FPC 181 receives an image signal or the like from the outside. In the embodiment, as shown by the arrow in the drawing, the organic EL display device 100 is a top-emission type organic EL display device that emits light toward the side of the TFT substrate 120 where a light-emitting layer is formed, but may be of a bottom-emission type.

Figure 2:
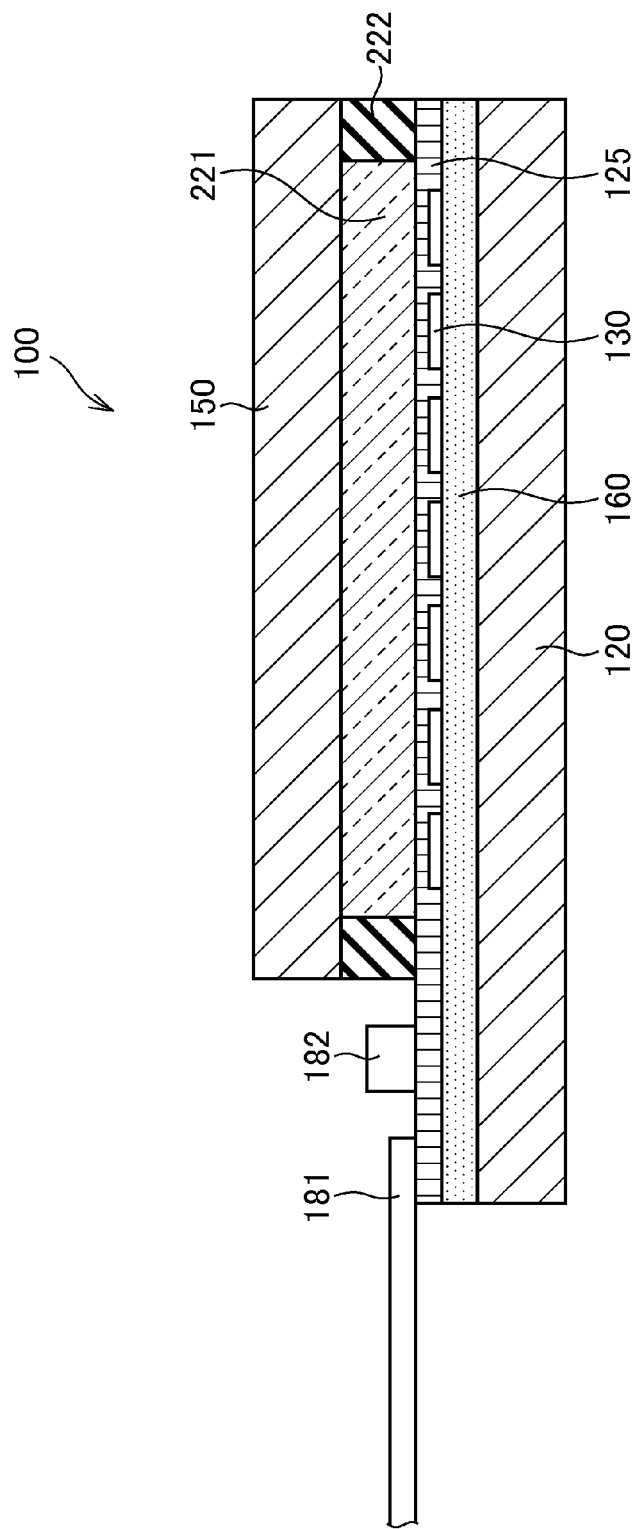
FIG. 2 is a diagram schematically showing a cross-section taken along the line II-II in FIG. 1.

FIG. 2 is a diagram schematically showing a cross-section taken along the line II-II in FIG. 1. As shown in the cross-sectional view, the TFT substrate 120 includes a TFT circuit layer 160 in which TFT circuits are formed, a plurality of organic EL elements 130 as a plurality of light-emitting elements formed on the TFT circuit layer 160, and a sealing film 125 covering the organic EL elements 130 to block moisture. Although as many organic EL elements 130 as the sub-pixels 212 included in the pixels 210 are formed, some of them are omitted in FIG. 2 for clarity of description. Color filters that transmit lights in different wavelength ranges corresponding to, for example, three colors or four colors, and a black matrix as a light-shielding film that blocks light emitted through each boundary between the sub-pixels 212 are formed on the counter substrate 150. A filler 221 composed of a transparent resin between the TFT substrate 120 and the counter substrate 150 is sealed by a sealant 222.

Figure 3:
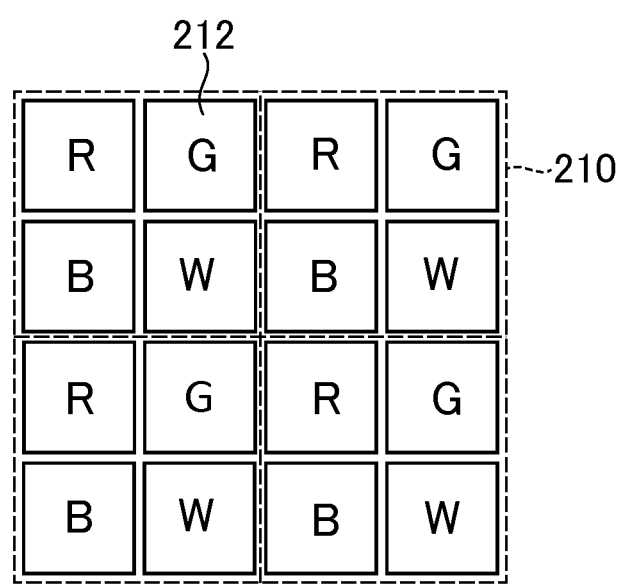
FIG. 3 is a diagram showing a configuration example of sub-pixels included in a pixel in FIG. 1.
Figure 4:
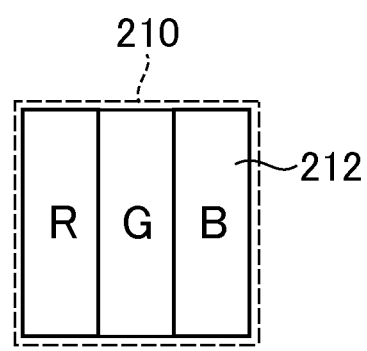
FIG. 4 is a diagram showing a configuration example of sub-pixels included in the pixel in FIG. 1.

Although the driver IC 182 is disposed on the TFT substrate 120 in the embodiment, the driver IC 182 may be disposed on the FPC 181. Moreover, the driver circuit may be directly formed on the TFT substrate 120. Moreover, the TFT substrate 120 can be formed of a flexible resin material, whereby the organic EL display device 100 can be configured without the counter substrate 150. In this case, the TFT substrate 120 may be configured integrally with the FPC 181. In the embodiment, a configuration is employed in which white light is emitted in the organic EL element 130 and lights in wavelength ranges corresponding to three colors or four colors are transmitted using color filters. However, a configuration may be employed in which lights in different wavelength ranges corresponding to, for example, three colors or four colors are emitted in the organic EL elements 130. FIG. 3 is a diagram showing a configuration example of the sub-pixels 212 included in the pixel 210 in FIG. 1. As shown in the drawing, the pixel 210 is composed of the sub-pixels 212 having substantially a rectangular shape and emitting lights in wavelength ranges corresponding to four kinds of colors, R (red), G (green), B (blue), and W (white). The sub-pixels 212 are arranged in a two-by-two matrix shape such that the sub-pixel 212 is in contact at two sides with other sub-pixels 212 in the same pixel 210. The configuration of the sub-pixels 212 in the pixel 210 is not limited to the configuration in FIG. 3. The configuration of the sub-pixels 212 may be a stripe configuration composed of sub-pixels 212 corresponding to three colors of RGB as shown in FIG. 4. Moreover, the configuration may be another stripe configuration using four kinds of colors of RGBW. The arrangement of the sub-pixels 212 constituting the pixel 210 is not limited to these configurations but can be appropriately determined.

Figure 5:
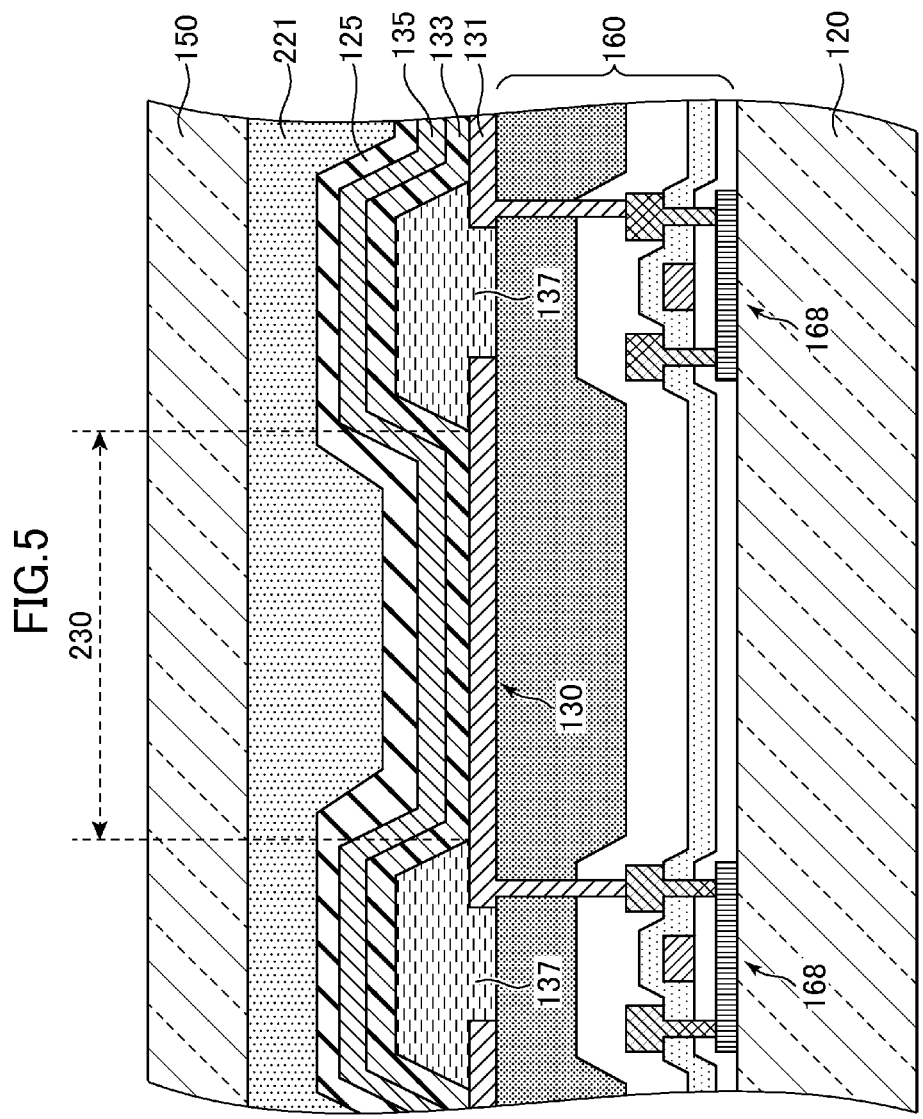
FIG. 5 is an enlarged diagram showing an example of a cross-section of a sub-pixel.

FIG. 5 is an enlarged diagram showing an example of a cross-section of the sub-pixel 212. As shown in the drawing, one of a source and a drain of each of driver transistors 168 in the TFT circuit layer 160 is composed of, for example, ITO (Indium Tin Oxide), Ag, or the like, and connected to a lower electrode 131 that is independent for each of the sub-pixels 212. Edges of the lower electrodes 131 are covered with a pixel separation film 137 composed of polymer dispersed liquid crystal whose light-transmitting and scattering properties change depending on the magnitude of an electric field, while maintaining an insulating property between the lower electrodes 131 of adjacent sub-pixels 212. An organic layer 133 including a light-emitting layer is deposited on the pixel separation film 137 and the lower electrodes 131 so as to cover the display area 205. The organic layer 133 is generally composed of a plurality of layers, and the plurality of layers may include a layer of inorganic material. In the embodiment, the whole of the pixel separation film 137 is composed of polymer dispersed liquid crystal. However, a configuration maybe employed in which a portion of the pixel separation film 137 includes polymer dispersed liquid crystal as will be described later.

Further, an upper electrode 135 that is paired with the lower electrode 131 to form a potential difference and thereby to cause the light-emitting layer to emit light is formed of a transparent electrode such as ITO. On the upper electrode 135, the sealing film 125 to prevent the entry of moisture is formed so as to cover the display area 205 for preventing the deterioration of the organic layer 133. Although the sealing film 125 is used in the embodiment, the entry of moisture into the organic layer 133 may be prevented by a method other than the use of the sealing film 125. The filler 221 composed of a transparent resin bonds the sealing film 125 with the counter substrate 150. On the counter substrate 150, a touch sensor, color filters, and a black matrix are formed as necessary. Here, the polymer dispersed liquid crystal may have properties such that the polymer dispersed liquid crystal is brought into a transmissive state of transmitting visible light when an electric field is increased, while the polymer dispersed liquid crystal is brought into a scattering state of scattering incident light when an electric field is not applied. In contrast, the polymer dispersed liquid crystal may have properties such that the polymer dispersed liquid crystal is brought into the scattering state of scattering visible light when an electric field is increased, while the polymer dispersed liquid crystal is brought into the transmissive state of transmitting incident light when an electric field is not applied (herein referred to as "reverse type". The polymer dispersed liquid crystal of the pixel separation film 137 has, for example, a scattering property regardless of the magnitude of an electric field formed by a potential difference between the upper electrode 135 and the lower electrode 131, so that the entry of light from the adjacent sub-pixel 212 can be prevented and thus optical color mixture can be suppressed. Moreover, optical color mixture can be efficiently suppressed while changing a scattering property with a potential difference between the upper electrode 135 and the lower electrode 131.

In each of the sub-pixels 212, the driver transistor 168 connected with the lower electrode 131 allows a current reflecting a gray-scale voltage of the sub-pixel 212 to flow, and causes the light-emitting layer in the organic layer 133 between the upper electrode 135 held at a common potential and the lower electrode 131 to emit light. The circuit in the TFT circuit layer 160 is of well-known type or appropriately designed to control the light emission of the light-emitting layer. The organic layer 133 can use a so-called microcavity effect, in which the organic layer 133 has a film thickness that is adjusted so as to intensify the light emitted through the upper electrode 135 using a resonance effect. When the microcavity effect is used, an adjustment can be made so as to especially increase a front luminance. In the embodiment, the organic layer 133 is a layer that covers the display area 205, and emission of, for example, W (white) or other colored light is performed in each of the sub-pixels 212. However, a configuration may be employed in which the light-emitting layer is colored in different colors for each of the sub-pixels 212, so that each of the pixels 210 includes the sub-pixels 212 that emit lights in wavelength ranges corresponding to different colors.

Figure 6:
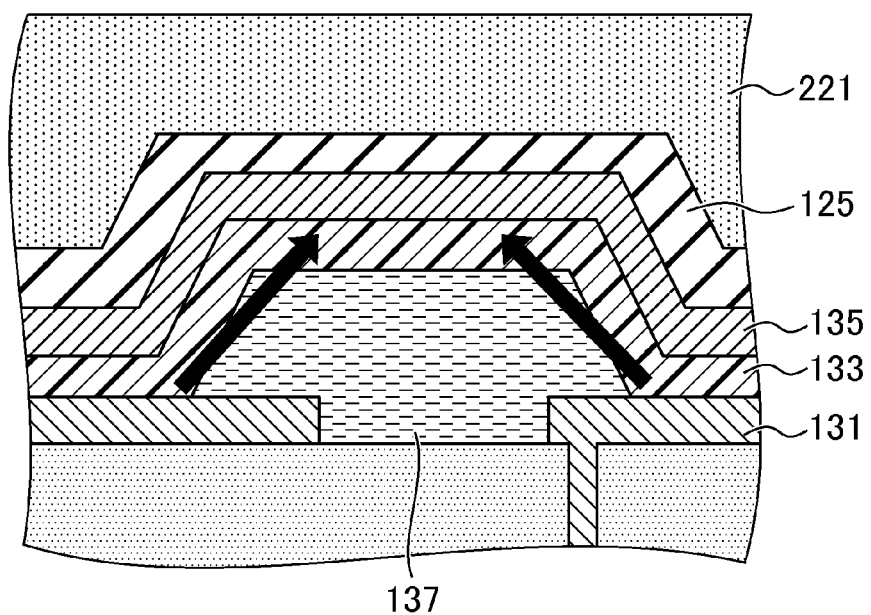
FIG. 6 is a diagram for explaining the state of light emitted in an oblique direction from a light-emitting layer of a sub-pixel when a potential difference between an upper electrode and a lower electrode is small.
Figure 7:
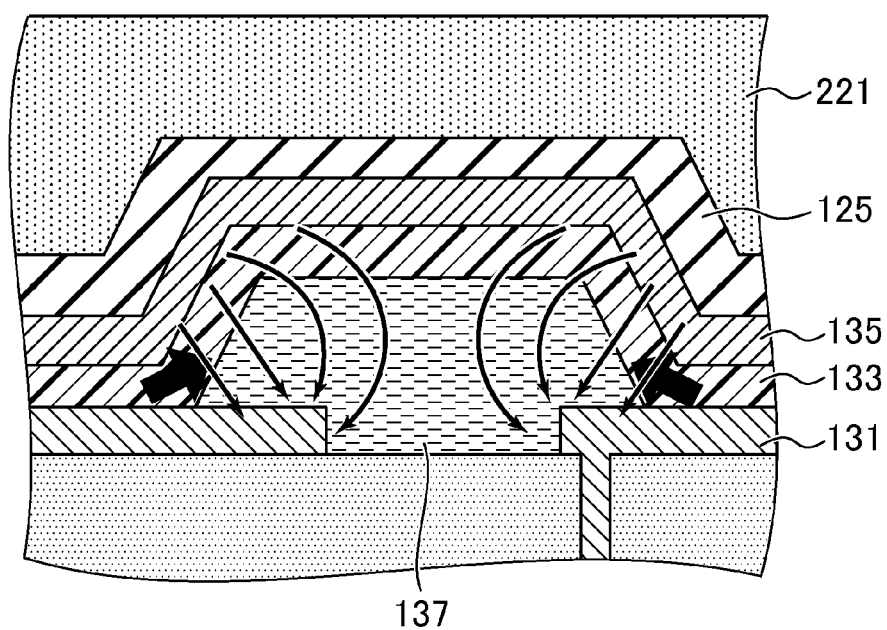
FIG. 7 is a diagram for explaining the state of light emitted in an oblique direction from the light-emitting layer of the sub-pixel when the potential difference between the upper electrode and the lower electrode is large.

FIGS. 6 and 7 are diagrams each for explaining the state of light emitted in an oblique direction from the light-emitting layer of the sub-pixel 212 when using the "reverse type" polymer dispersed liquid crystal described above in the configuration of FIG. 5. FIG. 6 is a diagram showing the case where a potential difference between the upper electrode 135 and the lower electrode 131 is small, in which the arrows show the state where the light is transmitting. In this case, the luminance of light emitted from the light-emitting layer is low, and the polymer dispersed liquid crystal of the pixel separation film 137 exhibits a high transmitting property. In the first place, a small amount of emitted light at a low luminance does not cause color mixture, and a small amount of emitted light with a low gray-scale value can be accurately controlled by enhancing the transmitting property.

FIG. 7 is a diagram showing the case where a potential difference between the upper electrode 135 and the lower electrode 131 is large compared to the case of FIG. 6. The thin arrows show the state where an electric field is formed, while the thick arrows show the state where light does not transmit. In this case, the polymer dispersed liquid crystal of the pixel separation film 137 exhibits a high scattering property. Since the light emitted in the light-emitting layer has a high luminance, optical color mixture caused by light emitted from an adjacent sub-pixel 212 is usually a problem. However, since the light does not transmit through the pixel separation film 137, the optical color mixture can be suppressed. Hence, according to the embodiment, the optical color mixture can be efficiently prevented even with higher definition pixels.

Figure 8:
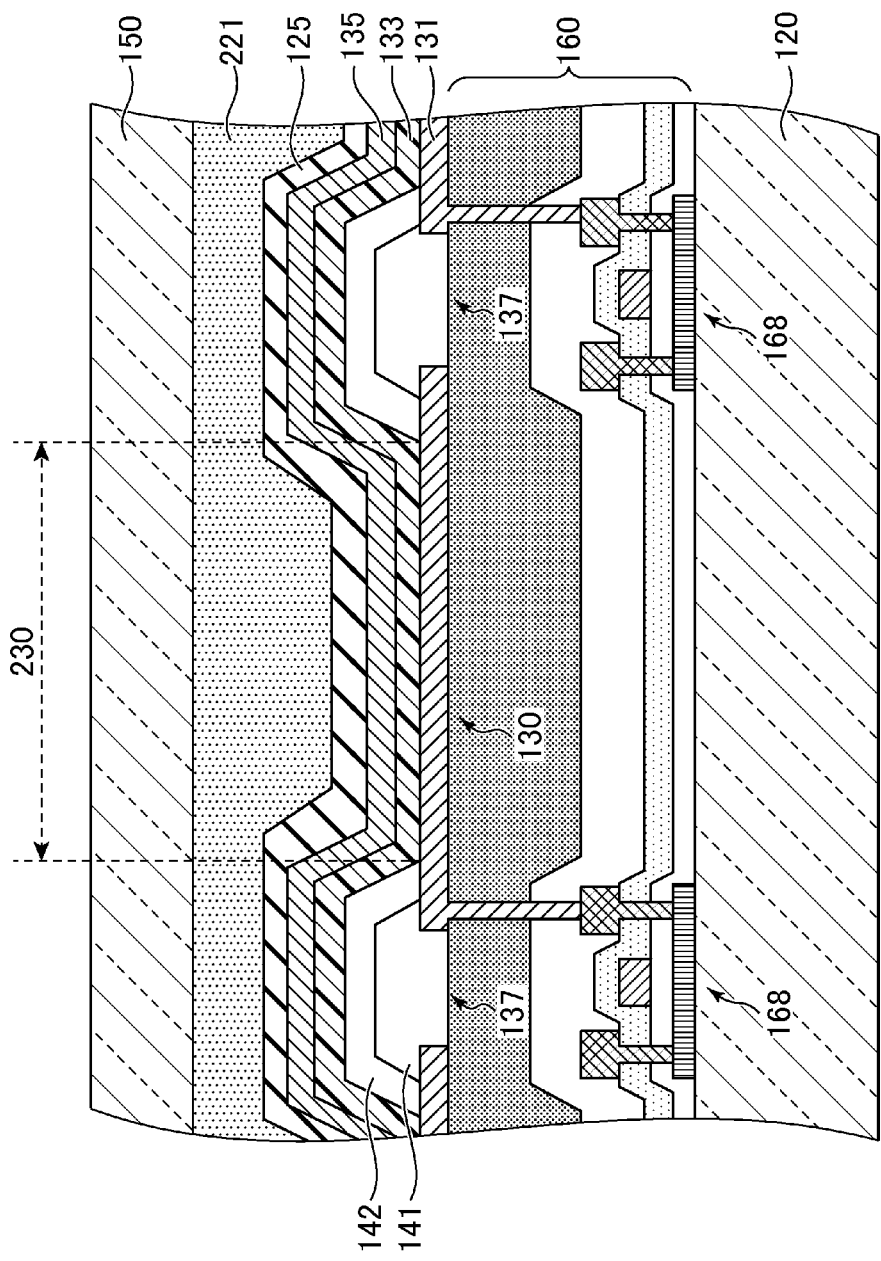
FIG. 8 is a diagram for explaining a first modified example in the same field of view as FIG. 5.

FIG. 8 is a diagram showing a cross-section of the sub-pixel 212 in the same field of view as FIG. 5, for explaining a first modified example of the embodiment described above. FIG. 8 differs from FIG. 5 in the configuration of the pixel separation film 137. The other configurations are the same as those in FIG. 5, and therefore, the description thereof is omitted. As shown in FIG. 8, the pixel separation film 137 in the first modified example includes a first portion 141 composed of an insulative inorganic material or organic material, and a second portion 142 composed of a polymer dispersed liquid crystal layer. The second portion 142 is formed on and covers the first portion 141.

Figure 9:
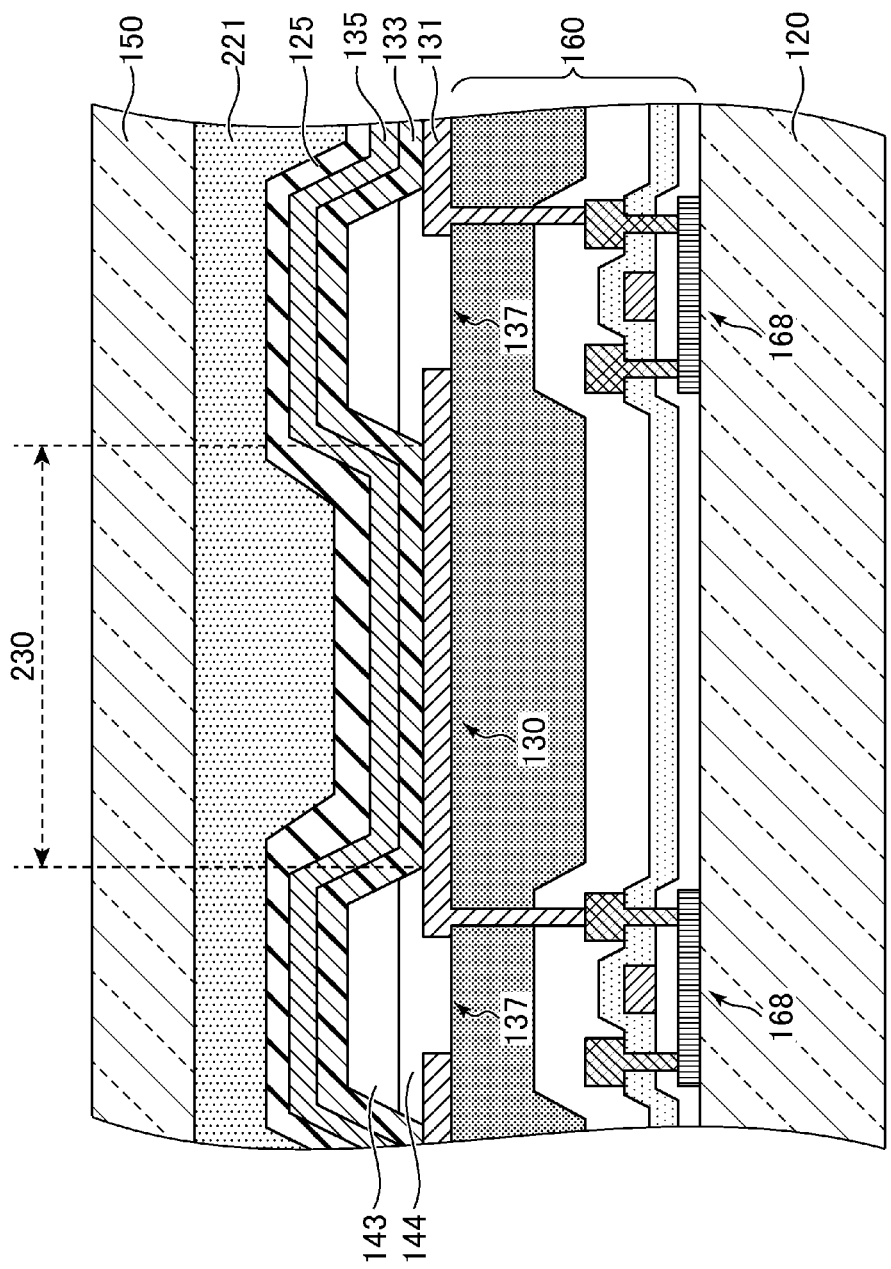
FIG. 9 is a diagram for explaining a second modified example in the same field of view as FIG. 5.

In this manner, the secondportion 142 is formed of, for example, a publicly known material that is used for the pixel separation film 137, and the second portion 142 composed of polymer dispersed liquid crystal is formed to have a relatively thin film thickness, whereby the control of the film thickness and shape of polymer dispersed liquid crystal in formation can be made easy. In this case, the second portion 142 composed of polymer dispersed liquid crystal is in contact with the lower electrode 131, so that the second portion 142 is easily affected by an electric field between the lower electrode 131 and the upper electrode 135. However, the polymer dispersed liquid crystal may not be in contact with the lower electrode 131. FIG. 9 is a diagram showing a cross-section of the sub-pixel 212 in the same field of view as FIG. 5, for explaining a second modified example of the embodiment described above. FIG. 9 differs from FIG. 5 in the configuration of the pixel separation film 137. The other configurations are the same as those in FIG. 5, and therefore, the description thereof is omitted. As shown in FIG. 9, the pixel separation film 137 in the second modified example includes a first portion 143 composed of an insulative inorganic material or organic material, and a second portion 144 composed of polymer dispersed liquid crystal. The first portion 143 is formed on the secondportion 144. Since the second portion 144 is composed of polymer dispersed liquid crystal, the same advantageous effect as that of the embodiment described above can be obtained. Moreover, a material having a higher light-shielding property than the second portion 144, for example, a colored opaque material is used for the first portion 143. For this reason, light emitted in an oblique direction can be blocked in the first portion 143. Moreover, even when the first portion 143 is formed so as to be in contact with the second portion 144 without being in contact with the lower electrode 131 and, for example, carbon nanotube blackbody having a function of p-type semiconductor is used to provide the first portion 143 with an action of absorbing leakage light, an insulating property between the first portion 143 and the lower electrode 131 can be maintained because the first portion 143 is not in electrical contact with the lower electrode 131. However, the material of the first portion 143 is not limited to this material, and materials other than this material can be used. With the configuration shown in FIG. 9, a configuration can be employed in which a black matrix is not provided on the counter substrate 150 due to the light-shielding property of the first portion 143. Moreover, a change of the transparency and scattering property of the polymer dispersed liquid crystal can be prevented from being visually recognized, so that display quality can be improved.

Various altered and modified examples within the range of the idea of the invention will occur to those skilled in the art, and it is understood that the altered and modified examples also belong to the scope of the invention. For example, when those skilled in the art appropriately add or remove a constituting element or change the design of a constituting element in the embodiments described above, or add or omit a process or change the conditions of a process in the embodiments described above, those are included in the scope of the invention as long as they include the gist of the invention.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a substrate including a display area composed of a plurality of pixels disposed in a matrix;
lower electrodes each formed in each of the plurality of pixels on the substrate and composed of a conductor;
an organic layer formed on the lower electrodes and including a light-emitting layer;
an upper electrode formed on the organic layer and composed of a conductor; and
a pixel separation film including a first layer composed of an insulating material and a second layer composed of polymer dispersed liquid crystal, the pixel separation film being in contact with edges of the lower electrodes to insulate between the lower electrodes of the pixels adjacent to each other, the first layer not including the polymer dispersed liquid crystal, the second layer having a part on and in directly physical contact with the lower electrodes.

2. The display device according to claim 1, wherein a degree of light scattering of the pixel separation film changes due to a change in potential difference between the upper electrode and the lower electrodes.

3. The display device according to claim 2, wherein the polymer dispersed liquid crystal has light scattering properties which increase with an increasing electric field applied thereto, while the polymer dispersed liquid crystal is brought into a state of transmitting incident light with no electric field is applied, and the degree of the light scattering of the pixel separation film increases as the potential difference between the upper electrode and the lower electrodes increases.

4. The display device according to claim 1, wherein the first layer is formed of a material having a higher light-shielding property than the second layer, located at an opposite side of the second layer from the lower electrodes, and formed in contact with the second layer without being in contact with the lower electrodes.

5. The display device according to claim 1, wherein the first layer has a top surface and a side surface intersecting with the top surface,
the second layer is located at an opposite side of the first layer from the lower electrode, and covers the top surface and the side surface.

6. A display device comprising:
a substrate including a first pixel and a second pixel adjacent to the first pixel;
a first lower electrode located in the first pixel;
a second lower electrode located in the second pixel;
a first organic layer formed on the first lower electrode and including a light-emitting layer;
a second organic layer formed on the second lower electrode and including a light-emitting layer;
a pixel separation film located at a boundary between the first pixel and the second pixel, the pixel separation film including a first layer composed of an insulating material and a second layer composed of polymer dispersed liquid crystal, the first layer not including the polymer dispersed liquid crystal, the second layer having a part on and in directly physical contact with the first and second lower electrodes; and
an upper electrode formed to straddle the first pixel, the second pixel, and the pixel separation film.

7. The display device according to claim 6, wherein the polymer dispersed liquid crystal has light scattering properties which increase with an increasing electric field applied thereto, while the polymer dispersed liquid crystal is brought into a state of transmitting incident light with no electric field is applied, and a degree of light scattering of the pixel separation film increases as a potential difference between the upper electrode and the first and second lower electrodes increases.

8. The display device according to claim 6, wherein the first layer is formed of a material having a higher light-shielding property than the second layer, located at an opposite side of the second layer from the first and second lower electrodes, and formed on and in contact with the second layer without being in contact with the first and second lower electrodes.

9. The display device according to claim 6, wherein the first layer has a top surface and a side surface intersecting with the top surface,
the second layer is located at an opposite side of the first layer from the first and second lower electrode, and covers the top surface and the side surface.

* * * * *